(12) United States Patent
Smith

(10) Patent No.: US 6,566,958 B1
(45) Date of Patent: May 20, 2003

(54) LOW POWER SYSTEMS USING ENHANCED BIAS CONTROL IN RAIL-TO-RAIL GAIN STAGE AMPLIFIERS

(75) Inventor: Steven O. Smith, Loveland, CO (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/712,322

(22) Filed: Nov. 14, 2000

Related U.S. Application Data
(60) Provisional application No. 60/165,579, filed on Nov. 15, 1999.

(51) Int. Cl.[7] ................................................. H03F 3/04
(52) U.S. Cl. .......................... 330/296; 330/228; 330/290
(58) Field of Search ................................. 330/288, 290, 330/296, 262

(56) References Cited

U.S. PATENT DOCUMENTS

| | | | | |
|---|---|---|---|---|
| 4,335,358 A | | 6/1982 | Hoeft | |
| 4,893,091 A | * | 1/1990 | Lillis et al. | 330/253 |
| 4,945,259 A | * | 7/1990 | Anderson | 307/296.1 |
| 5,070,308 A | * | 12/1991 | Padi | 330/268 |
| 5,162,751 A | | 11/1992 | Blanken et al. | |
| 5,440,273 A | | 8/1995 | Gusinov et al. | |
| 5,521,553 A | | 5/1996 | Butler | |
| 5,734,296 A | | 3/1998 | Dotson et al. | |
| 5,767,662 A | * | 6/1998 | Perkins | 330/301 |
| 5,786,731 A | | 7/1998 | Bales | |
| 6,043,714 A | * | 3/2000 | Yamamoto et al. | 330/296 |
| 6,104,244 A | | 8/2000 | Gilbert | |
| 6,184,750 B1 | * | 2/2001 | Somerville | 330/255 |

\* cited by examiner

*Primary Examiner*—Henry Choe
(74) *Attorney, Agent, or Firm*—Sidley Austin Brown & Wood LLP

(57) ABSTRACT

An apparatus and method for biasing the gain stage of an amplifier which may result in high signal gain, stable quiescent bias, and which controls the current in the quiescent state. A bias reference signal is coupled to the base of a gain stage transistor, and a bias feedback signal is coupled to adjust the bias reference signal based on the bias current of the gain stage transistor. The bias reference signal can be coupled to an input signal that is input to the base of the gain stage transistor. A compensation element can be coupled to the base of the gain stage transistor to control the time response of the gain stage transistor.

20 Claims, 6 Drawing Sheets

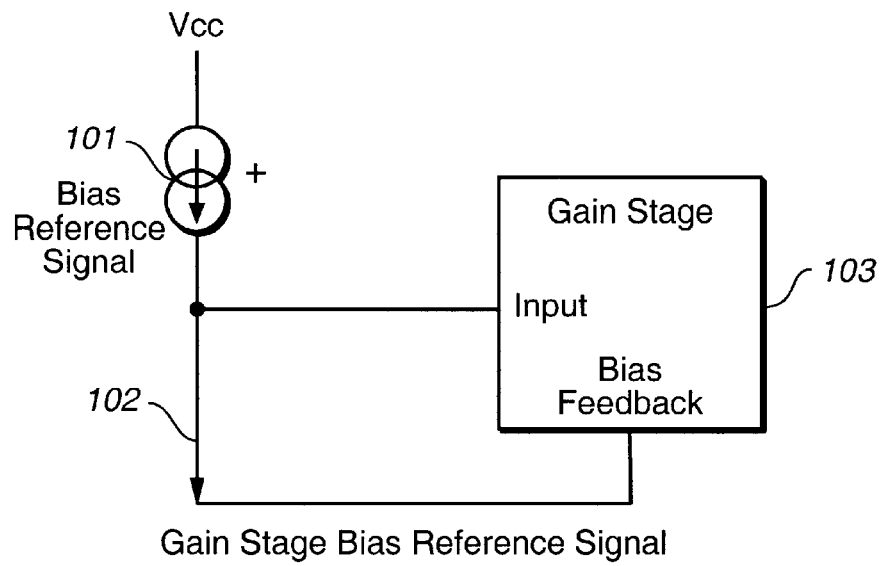
FIG._1
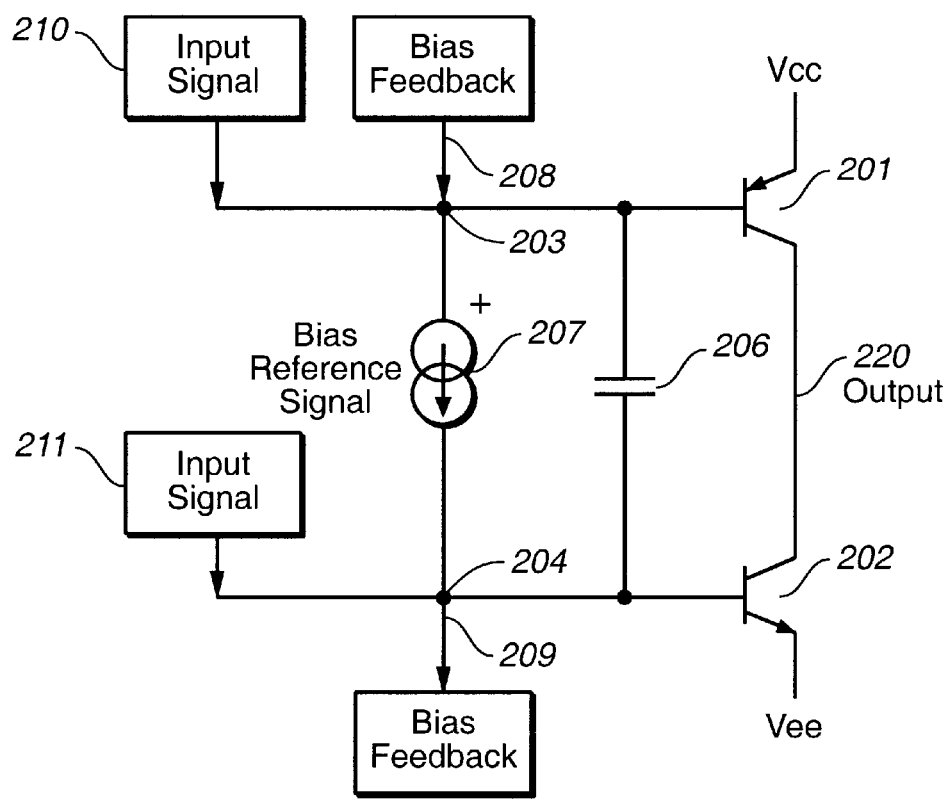
FIG._2

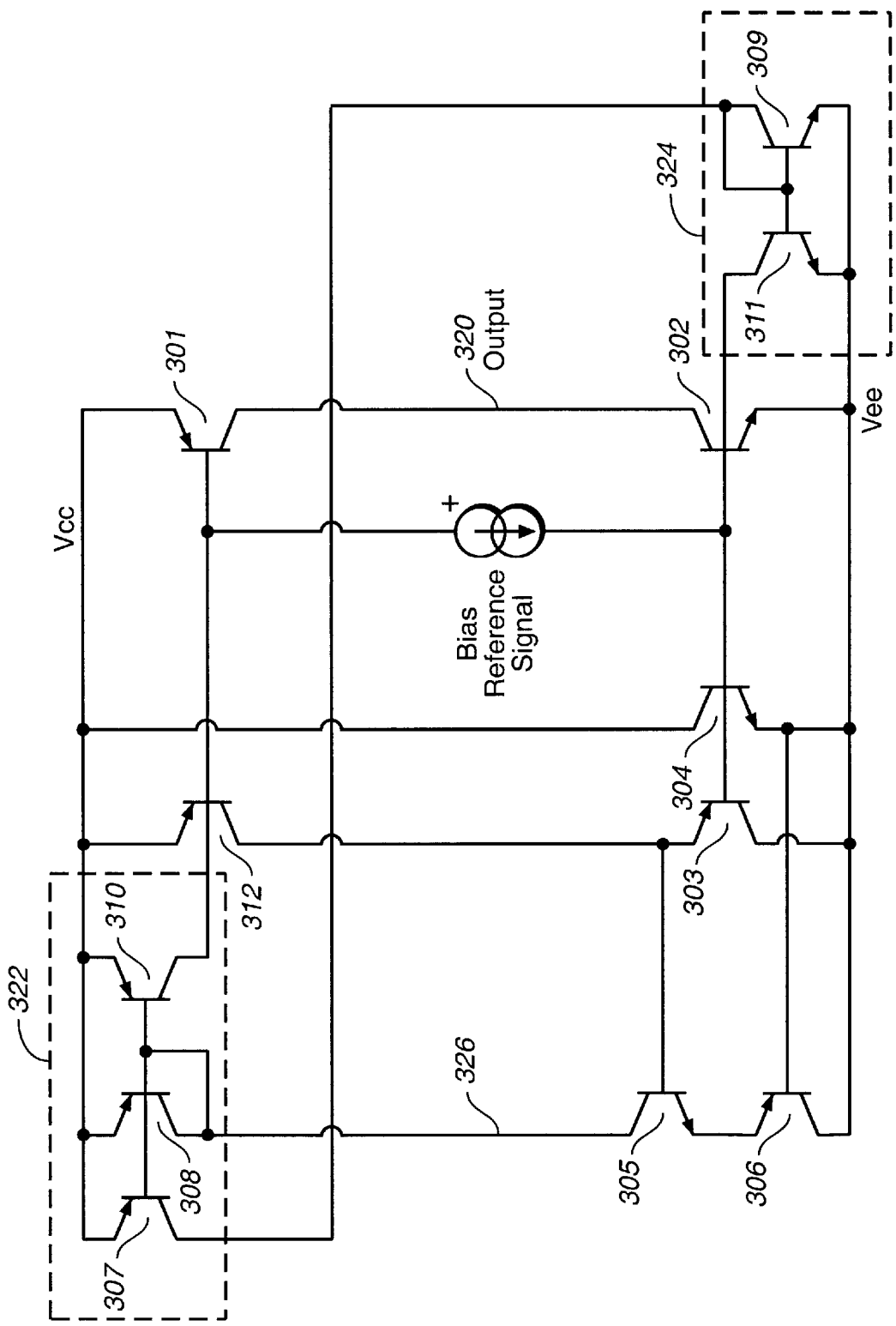
FIG._3

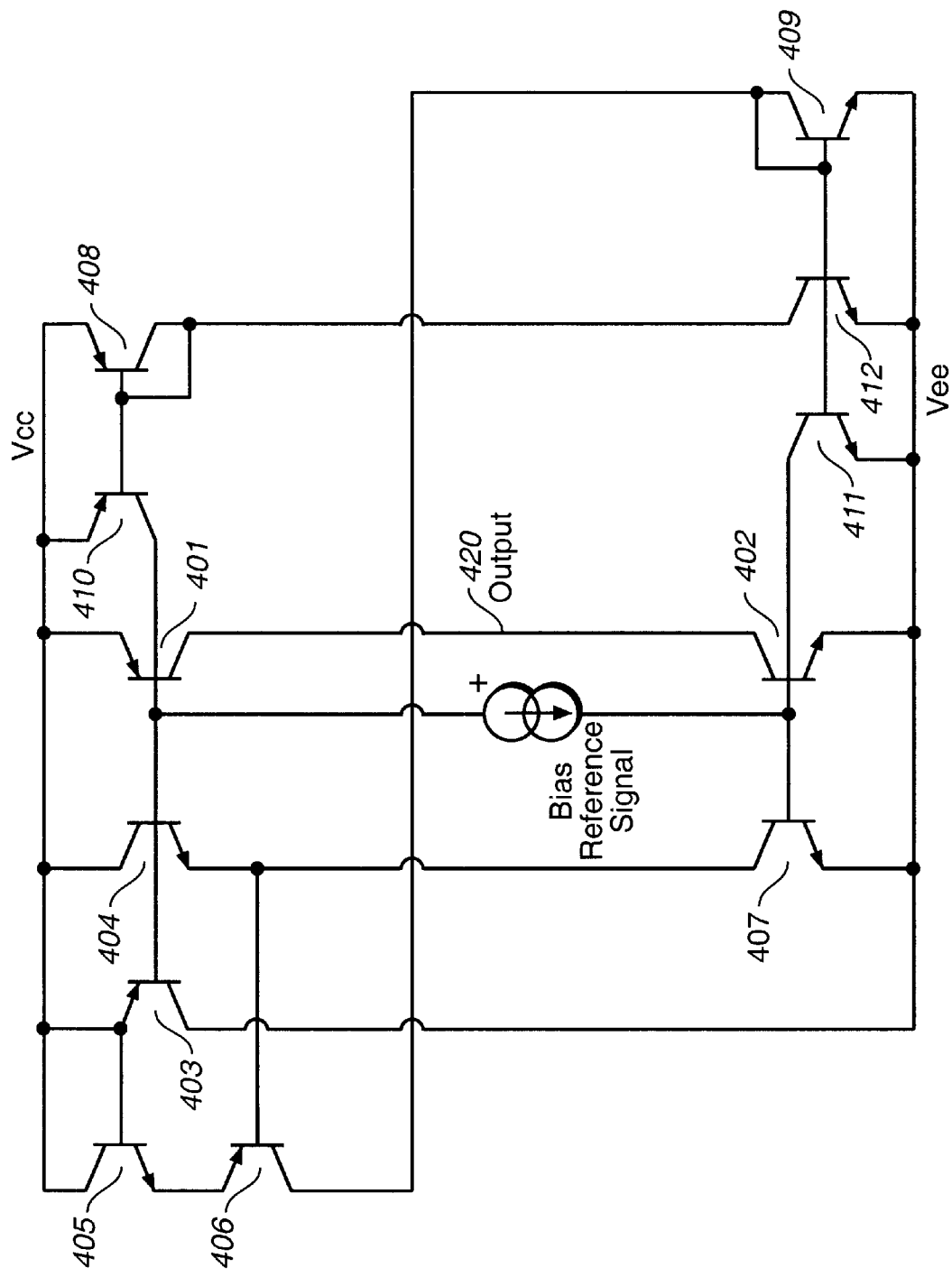
FIG._4

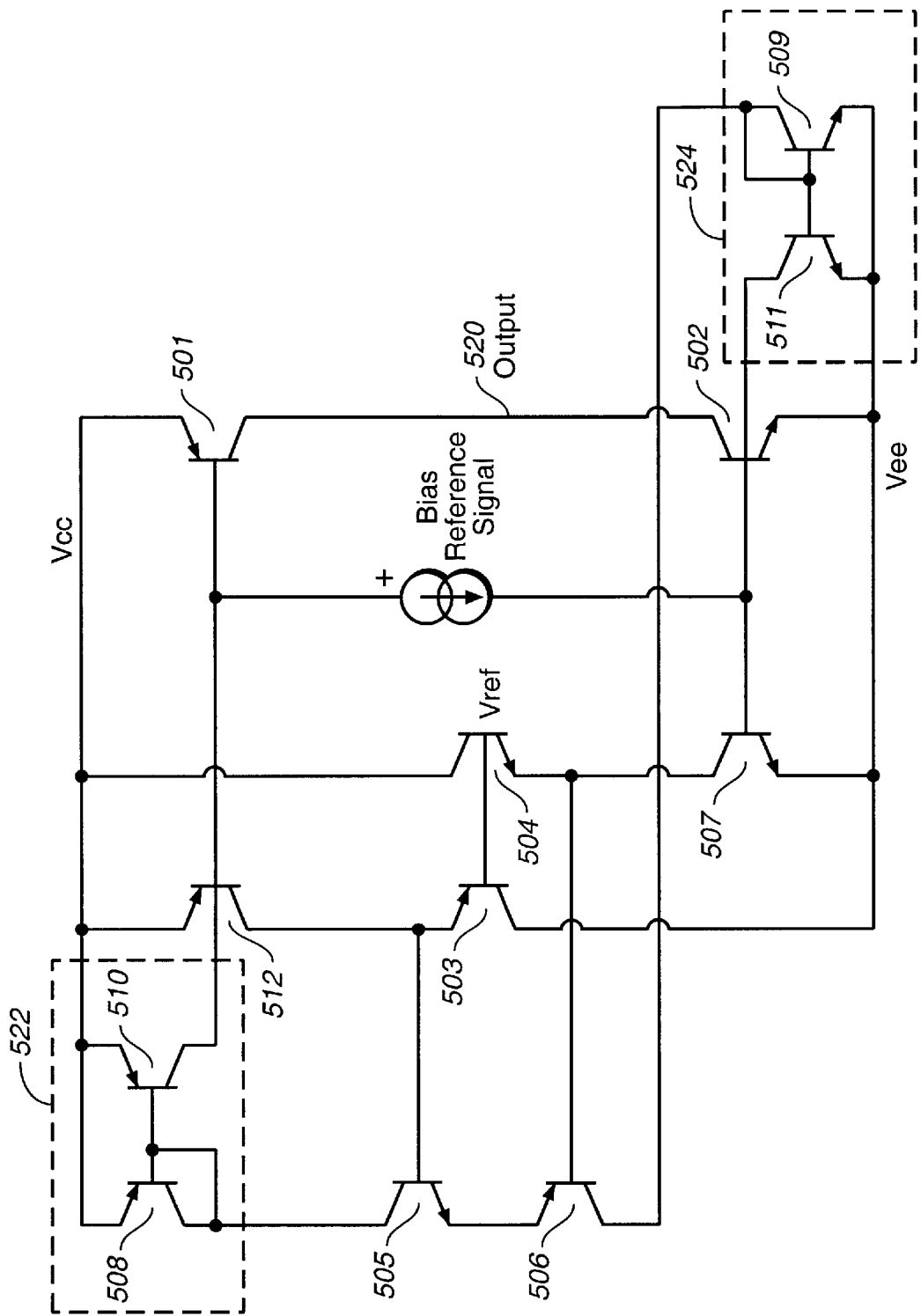
FIG._5

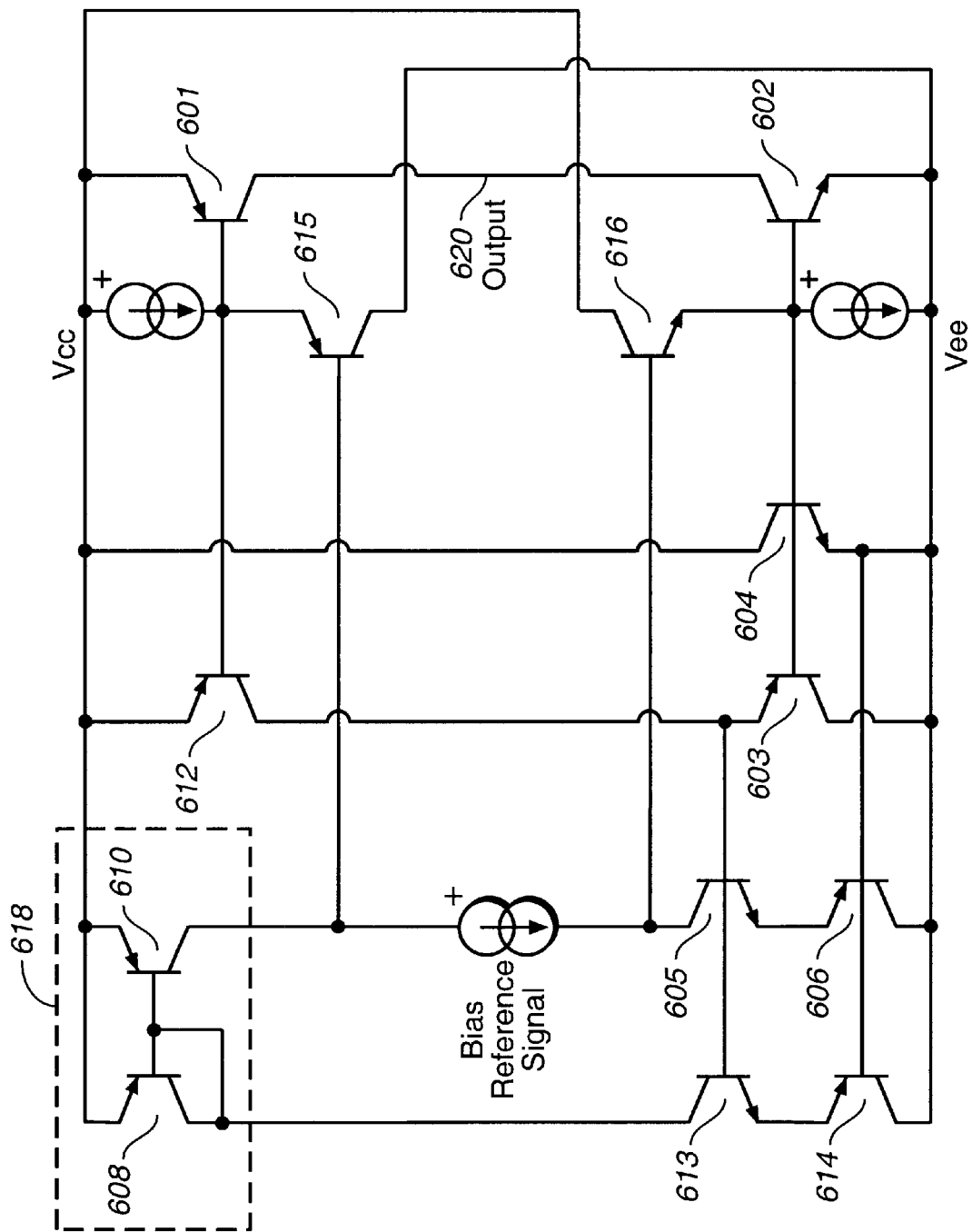
FIG._6

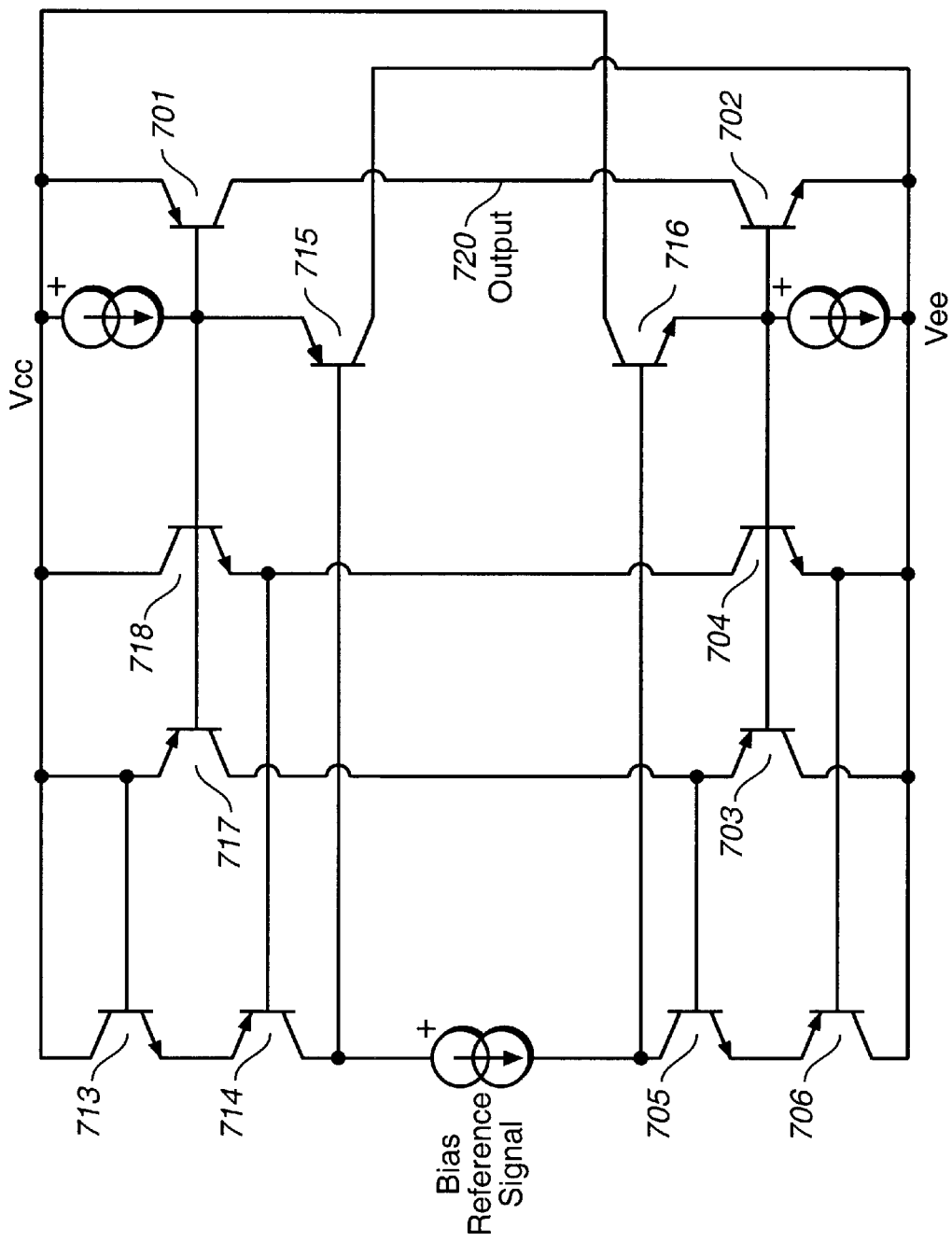
FIG._7

LOW POWER SYSTEMS USING ENHANCED BIAS CONTROL IN RAIL-TO-RAIL GAIN STAGE AMPLIFIERS

CROSS REFERENCE TO RELATED APPLICATIONS

The present invention is related to the subject matter of the following provisional United States Patent Application: "Low Power Systems Using Enhanced Bias Control In Rail-to-Rail Gain Stage Amplifiers," naming inventor Steven O. Smith, filed Nov. 15, 1999, Ser. No. 60/165,579. Applicants hereby claim the benefit under 35 U.S.C. §119(e) of the foregoing-referenced provisional applications. The foregoing-referenced provisional patent application is hereby incorporated by reference herein in its entirety.

BACKGROUND OF THE INVENTION

The present invention relates generally to low power equipment such as telecommunications systems, displays, and the like, ranging from cell phones to simply battery powered devices, in which amplification is necessary and in which either power consumption or stable operation in an integrated circuit in its quiescent state is an important consideration. The present invention involves a variety of designs which provide alternative techniques to achieve bias control in a variety of amplifier arrangements.

Supply voltages in electronic equipment are continually decreasing. Logic circuits are continually using faster but lower breakdown devices, forcing supply voltages lower. Battery powered circuits such as wireless telephones use the lowest practical voltage to minimize power consumption. This makes it imperative for analog circuitry to make use of every bit of the supply voltage range, and has caused the creation of rail-to-rail gain stages, which can swing almost from one supply voltage rail to the other. This is especially important in low power devices, that is, devices in which power consumption is an important consumer or user consideration and/or desire.

A problem with building amplifiers with rail-to-rail gain stages, however, is that they tend to be much more complex than traditional amplifiers. Large signal swings in an output stage can be accommodated most easily by making the output stage a common emitter gain stage. When implemented in a complementary form (with both pnp and npn devices), some form of bias control circuitry is needed, which adds complexity to the circuit. The bias control circuit also adds another feedback loop requiring stabilization and isolation from the input signal feedback loop.

While there have been a variety of solutions proposed for such designs—and while those solutions achieve their various goals to a large degree, to date no single design achieves its goals in a design which provides the simplicity and the alternative designs of the present invention. As but one example, one design is set forth in U.S. Pat. No. 5,521,553, hereby incorporated by reference. As that example explains, there have been a variety of efforts, yet there still remains room for improvement from a practical perspective whether it be in minimizing complexity, reducing component count, to achieve even more stable operation, or the like. Similar efforts are detailed in U.S. Pat. Nos. 5,440,273, 5,786,731, 5,162,751, 4,335,358, and 5,734,296. All the foregoing references are hereby incorporated by reference. Thus, even though solutions to the problems mentioned in this disclosure have existed, to date none are believed to have provided the proper balance of competing concerns in most applications and certainly none have met the various criteria now met—especially in the telecommunications device area or the like.

Further, the present invention shows that alternative designs can be accomplished with different attributes than those previously existing. For some particular applications, these designs could be critical to their specific goals. To some degree the designs disclosed show that in spite of a long felt but unsatisfied need for additional designs and attributes, there are in fact, other designs which were available. These even may be viewed as implementing arts and elements which had long been available, but were not realized in the past. Perhaps to some degree, those skilled in the art did not appreciate or even realize the existing problem. It may even be true that those involved in this field simply taught away from the technical direction in which the inventor went with this invention, that they did not expect the results now achieved, or that they did not believe such results could be achieved in this fashion.

SUMMARY OF THE INVENTION

The present invention discloses both methods and embodiments of apparatus for providing telecommunications equipment or the like and perhaps even for generally biasing an amplifier stage which may result in high signal gain, stable quiescent bias, and which controls the current in the quiescent state. The alternative apparatuses and methods for biasing the electronic gain stage can achieve not only a stable operation and provide useful alternatives, they can also meet several practical considerations. Specifically, in various embodiments, the invention focuses on circuit techniques useful in biasing a common emitter gain stage in an integrated circuit amplifier as may be used in battery powered devices, telecommunications equipment, or the like. In some of the embodiments disclosed, a key to effective bias control can lie in minimizing the number of transistors needed and in keeping the effects of input signal changes and bias control changes orthogonal. A basic method in these embodiments can consist of controlling the input of the gain stage 103 by balancing two signals against each other, a bias reference signal 101 and a feedback signal representing the bias in the gain stage 102 as shown in FIG. 1. The reference signal may be made up of a bias reference signal combined with an input signal in such a manner that the input signal has high gain to the output and the reference signal has low gain to the bias point. Naturally, the feedback signal representing the bias in the gain stage 102 may take several forms, depending on the desired result.

Accordingly, the present invention advantageously provides a simple method of controlling the bias in the gain stage without decreasing the high gain desired for signals. This may allow, for instance, the easy introduction of the desired temperature coefficient to the gain stage bias without degrading the signal gain.

Another advantage of the present invention is that several possible control methods can be used for the gain stage bias. These methods can include techniques such as Geometric Mean Biasing or Harmonic Mean Biasing, as well as other methods.

Naturally further objects of the invention are disclosed or should be understood throughout other areas of the specification and drawings.

BRIEF DESCRIPTION OF THE DRAWINGS

FIG. 1 and FIG. 2 show a block diagrams illustrating some basic embodiments of the invention.

FIG. 3 shows one implementation of the invention.

FIG. 4 and FIG. 5 show alternate implementations.

FIG. 6 and FIG. 7 show additional modifications of the circuits in FIGS. 3–5, including additional buffering in the gain stage.

DETAILED DESCRIPTION OF THE PREFERRED EMBODIMENTS

The application of the basic method shown in FIG. 1 to a complementary common emitter gain stage is shown in FIG. 2. Stable bias in a complementary gain stage is very important. Without stable bias control, both the positive and negative devices (pnp and npn gain stage transistors 201 and 202 in FIG. 2) can increase in current at the same time while the bias current in the gain stage can be at any level, allowing the bias to run away until damage occurs.

FIG. 2 shows one embodiment of the present invention with connections of Bias Feedback and Bias Reference signals to achieve a stable gain stage bias point. When the Bias Reference signal 207 increases, it acts on the inputs of the gain stage 203 and 204 to cause the bias of gain transistors 201 and 202 to both increase. Bias Feedback signals 208 and 209 are applied to the gain stage inputs 203, 204 with the opposite sign so that as the bias of the gain stage transistors 201, 202 increases, the Bias Feedback signals can cause the gain stage transistors' bias to decrease (negative feedback). The actions of Bias Reference signal 207 and Bias Feedback signals 208, 209 can be described as analogous to a "common mode" action, where the bias of both gain stage transistors 201, 202 is affected in the same way. The input signals 210, 211 may be applied in a different fashion. The input signals 210, 211 may be applied to both gain stage inputs, but in a fashion such that it may cause one gain stage transistor 201 to increase in bias, while the bias of the other gain stage transistor 202 may decrease. This in turn may cause the input signal gain to output 220 to be large. The action of the input signals 210, 211 can be described as analogous to a "differential mode" action.

Compensating the bias control loop may be done by connecting a compensation element such as a small capacitor 205 between the inputs of the gain stage transistors 201, 202. If the bias signal in both gain stage transistors 201, 202 is increasing, the voltage on both bases can move toward each other, which may be slowed by the presence of the capacitor 205. Note that input signals 210, 211 can be arranged to act to charge both ends of capacitor 205 in the same direction, and may not cause a changing voltage across the capacitor 205. This can prevent capacitor 205 from having an effect on input signals 210, 211.

FIG. 3 shows another embodiment of the invention that uses Geometric Mean biasing. Transistors 301 and 302 can be configured to form the gain stage, with signal 320 being the output. Transistors 312 and 304 can be arranged to carry the same currents as transistors 301 and 302, although they may be scaled so that their currents are proportional to the currents in transistors 301 and 302. Transistors 307, 308, and 310 can also form a pnp current mirror 322 and transistors 309 and 311 can form an npn current mirror 324. In addition, transistors 303–306 can create the feedback signal representing the bias in the gain stage. The npn and pnp current mirrors can apply Bias Feedback Signal 326 (collector current of transistor 305) to the inputs of the gain stage transistors 301, 302. The input signal and compensation are not shown, but they can be easily applied to the bases of transistors 301, 302 similar to the circuit shown in FIG. 2.

Geometric Mean biasing in the case of FIG. 3 means that the collector current of transistor 305 is proportional to the square root of the product of the collector currents of transistors 303 and 304, which can be in turn proportional to the gain stage bias (collector currents of 301 and 302). This can be seen by writing equations showing the relation of the collector currents of transistors 305 and 306 to the collector currents of transistors 303 and 304:

Ic304=Ic302, the npn gain stage transistor bias
Ic312=Ic301, the pnp gain stage transistor bias
Ic303=Ic312

Note also that the currents in transistors 304, 312 may also be scaled versions of the currents in transistors 301 and 302. Summing the base emitter voltages from the emitter of transistors 303 to the emitter of transistor 304:

$$Vbe303+Vbe304=Vbe305+Vbe306$$

If the transistors 303, 304 are matched or scaled to transistors 305, 306, respectively, this can result in the following relationship:

$$Ic303*Ic304=Ic305*Ic306$$

by means of the exponential relationship between collector current (Ic) and base-emitter voltage (Vbe).

Since Ic of transistor 305 can be approximately equal to Ic of transistor 306, this shows that Ic305 can be proportional to the square root of the product of Ic303 and Ic304.

The end result of Geometric Mean biasing is that as one of the gain stage transistor's bias current increases, the other decreases in an inversely proportional manner. By using different currents to bias transistors 303 and 304, different forms of bias can be constructed, such as Harmonic Mean biasing. The basic concepts of Geometric and Harmonic Mean biasing are well-known by those of ordinary skill in the art.

Note that the group of transistors 303–306 producing the Bias Feedback signal 326 in FIG. 3 are shown near the negative supply voltage Vee, but they can be biased at other voltages between the supplies, and still produce the same Bias Feedback signal. Implementations having transistors akin to transistors 303–306 referenced at different voltages are shown in FIGS. 4 and 5.

FIG. 4 shows the invention implemented with the Geometric Mean bias transistors 403–406 referenced to the positive supply voltage Vcc. The function of the circuit in FIG. 4 can be understood as being otherwise identical to the circuit in FIG. 3 in one embodiment.

FIG. 5 shows the invention implemented with the Geometric Mean bias transistors 503–506 referenced to a voltage Vref, falling between the positive supply voltage Vcc and negative supply voltage Vee. This circuit can function in one embodiment in a very similar manner to FIG. 3, with small rearrangements in the biasing. Transistors 501 and 502 can be configured to be the gain stage, with transistors 512 and 507 conducting the same (or scaled) bias currents respectively as the gain stage transistors 501, 502. The currents in transistors 512 and 507 can be input to transistors 503 and 504, respectively. This can make transistors 505 and 506 conduct the Geometric Mean gain stage bias feedback signal. This signal can then be applied to the inputs of the gain stage via the current mirrors 522, 524 formed by transistors 508, 510 and 509, 511, respectively.

FIG. 6 shows the invention implemented with the gain stage transistors 601, 602 buffered by emitter follower transistors 615, 616, respectively. This modification allows a different method of applying the Geometric Mean bias signal to the gain stage input. Instead of using two current mirrors to apply the Geometric Mean bias feedback, one of them may be replaced with transistors 613, 614 in the group of transistors producing the Bias Feedback signal. Transistor 604 can be configured to conduct the same or scaled current as 602, and transistors 612 and 603 can conduct the same or scaled current as 601. This can cause transistors 605, 606, 613 and 614 to conduct the Geometric Mean Bias Feedback signal. Transistor 605 can then apply this signal directly to the gain stage transistor 602 via the base of transistor 616, while transistor 613 can apply this signal to the other gain stage transistor 601 via the base of transistor 615 via the current mirror 618 formed by transistors 608, 610.

FIG. 7 shows the invention implemented with the gain stage transistors 701, 702 buffered by emitter follower transistors 715, 716, respectively, and two Geometric Mean bias signal stages. Transistors 704 and 717 can conduct the same (or scaled) currents as transistors 702 and 701 respectively. The currents in transistors 704 and 717 can be reused in biasing transistors 718 and 703, making their currents the same (or scaled) as the currents in transistors 702 and 701 respectively. Using the same analysis of FIG. 3, it can be seen that transistors 713, 714, 705 and 706 all can conduct the Geometric Mean Bias Feedback signal. Transistor 714 can apply this signal directly to one input of the gain stage (base of transistor 715) and transistor 705 can apply this signal directly to the other input of the gain stage (base of transistor 716). The use of two Geometric Mean bias signal stages can have several advantages. First, it can provide faster feedback due to the removal of the current mirrors. Second, it can consume less current due to the reuse of two currents. Third, it can require fewer transistors (compared with FIG. 6).

While bipolar transistors are used in the Figures, it should be understood that other electronic devices such as field effect transistors can be used in their place and are to be considered as encompassed by this disclosure. The gain stage may be made of single transistors as shown in FIG. 2, or it may use multiple devices such as an emitter follower (shown in FIGS. 6 and 7), a Darlington, or other composite transistor connection.

As can be understood from the foregoing, the basic concepts of the present invention may be embodied in a variety of ways. It involves biasing techniques in general, control modes, biasing techniques for telecommunications-type devices, biasing techniques for battery powered or low power devices, such devices themselves, as well as devices to accomplish the appropriate functions. In this application, the biasing techniques are disclosed as part of the results shown to be achieved by the various devices described and as steps which are inherent to utilization. They are simply the natural result of utilizing the devices as intended and described. In addition, while only some general devices are disclosed, it should be understood that these can be applied within cellular telephones, communications devices, and the like. Further, these not only accomplish certain methods but also can be varied in a number of ways. Importantly, as to all of the foregoing, all of these facets should be understood to be encompassed by this disclosure.

The discussion included in this application is intended to serve as a basic description. The reader should be aware that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

It should also be understood that a variety of changes may be made without departing from the essence of the invention. Such changes are also implicitly to included in the description. They still fall within the scope of this invention. Further, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all actions may be expressed as a means for taking that action or as an element which causes that action. Similarly, each physical element disclosed should be understood to encompass a disclosure of the action which that physical element facilitates. Regarding this last aspect, as but one example, the disclosure of a "compensation element" should be understood to encompass disclosure of the act of "compensating" —whether explicitly discussed or not—and, conversely, were there only disclosure of the act of "compensating", such a disclosure should be understood to encompass disclosure of a "compensation element" and even a "means for compensating" Such changes and alternative terms are to be understood to be explicitly included in the description.

In this regard, all references in the disclosure or listed in the list of References to be Incorporated filed with the application are hereby incorporated by reference. The terms used in those references for the various elements which this invention involves should be understood to be included as a part of this disclosure. Noteworthy, however, is the fact that to the extent statements in any of those references might be considered inconsistent with the patenting of this/these invention(s) such statements are expressly not to be considered as made by the applicant(s).

What is claimed is:

1. An apparatus for biasing current at a rail-to-rail stage of an amplifier, the apparatus comprising:

a first transistor having a base and a collector, a second transistor having a base and a collector, the collector of the second transistor being coupled to the collector of the first transistor;

a third transistor having a base and a collector, the third transistor coupled in emitter follower arrangement with the first transistor, a fourth transistor having a base and a collector, the fourth transistor coupled in emitter follower arrangement with the second transistor;

a fifth transistor having a base and a collector, wherein the base of the fifth transistor is coupled to the base of the first transistor, a sixth transistor having a base, an emitter, and a collector, wherein the base of the sixth transistor is coupled to the base of the second transistor, wherein the emitter of the sixth transistor is coupled to the collector of the fifth transistor;

a bias reference source coupled to the base of the third transistor at a first node and coupled to the base of the fourth transistor at a second node, the bias reference source operable to provide a bias reference signal;

the first node operable to receive a first bias feedback signal; and the second node operable to receive a second bias feedback signal.

2. The apparatus of claim 1 further comprising a bias feedback circuit for generating at least one of the first and second bias feedback signals.

3. The apparatus of claim 2 wherein the bias feedback circuit comprises a current mirror.

4. The apparatus of claim 2 wherein the bias feedback circuit comprises:
a seventh transistor having a base and a collector, wherein the base of the seventh transistor is coupled to the collector of the seventh transistor; and
an eighth transistor having a base and a collector, wherein the base of the eighth transistor is coupled to the base of the seventh transistor.

5. The apparatus of claim 2 wherein the bias feedback circuit comprises:
seventh transistor and an eight transistor coupled in series, each of the seventh and eighth transistors having a respective base; and
a ninth transistor and a tenth transistor coupled in series, each of the ninth and tenth transistors having a respective base.

6. The apparatus of claim 5 wherein the bases of the seventh and ninth transistors are coupled to the emitter of the sixth transistor.

7. The apparatus of claim 1 wherein at least one of the first and second bias feedback signals comprises a geometric mean bias feedback signal.

8. The apparatus of claim 1 wherein at least one of the first and second bias feedback signals comprises a harmonic mean bias feedback signal.

9. The apparatus of claim 1 wherein the base of the third transistor receives a first input signal and wherein the base of the fourth transistor receives a second input signal.

10. An apparatus for biasing current at a rail-to-rail stage of an amplifier, the apparatus comprising:
a first transistor having a base and a collector,
a second transistor having a base and a collector, the collector of the second transistor being coupled to the collector of the first transistor;
a third transistor having a base and a collector, the third transistor coupled in emitter follower arrangement with the first transistor;
a fourth transistor having a base and a collector, the fourth transistor coupled in emitter follower arrangement with the second transistor;
a fifth transistor having a base and a collector, wherein the base of the fifth transistor is coupled to the base of the first transistor;
a bias reference source coupled to the base of the third transistor and to the base of the fourth transistor, the bias reference source operable to provide a bias reference signal;
a first bias feedback circuit operable to generate a first bias feedback signal, the first bias feedback circuit having a current mirror; and
a second bias feedback circuit operable to generate a second bias feedback signal the second bias feedback signal comprising one of a geometric mean bias feedback signal and a harmonic mean bias feedback signal;
wherein the second bias feedback circuit comprises a sixth transistor having a base, an emitter, and a collector, wherein the base of the sixth transistor is coupled to the base of the second transistor, wherein the emitter of the sixth transistor is coupled to the collector of the fifth transistor.

11. The apparatus of claim 10 wherein the current mirror of the first bias feedback circuit comprises:
a seventh transistor having a base and a collector, wherein the base of the seventh transistor is coupled to the collector of the seventh transistor; and
an eighth transistor having a base and a collector, wherein the base of the eighth transistor is coupled to the base of the seventh transistor.

12. The apparatus of claim 11 wherein the collector of the eighth transistor is coupled to the base of the third transistor.

13. The apparatus of claim 10 wherein the base of the third transistor receives a first input signal and wherein the base of the fourth transistor receives a second input signal.

14. An apparatus for biasing current at a rail-to-rail stage of an amplifier, the apparatus comprising:
a common emitter gain stage comprising a first transistor and a second transistor, each of the first and second transistors having a base and a collector, wherein the collector of the second transistor is coupled to the collector of the first transistor;
a third transistor having a base and a collector, the third transistor coupled in emitter follower arrangement with the first transistor of the common emitter gain stage;
a fourth transistor having a base and a collector, the fourth transistor coupled in emitter follower arrangement with the second transistor of the common emitter gain stage;
a bias reference source coupled to the base of the third transistor and to the base of the fourth transistor, the bias reference source operable to provide a bias reference signal; and
means coupled to the gain stage for biasing the gain stage, the means operable to balance the bias reference signal against a feedback signal representing bias in the gain stage, wherein the means for biasing comprises:
a fifth transistor having a base and a collector, wherein the base of the fifth transistor is coupled to the base of the first transistor,
a sixth transistor having a base, an emitter, and a collector, wherein the base of the sixth transistor is coupled to the base of the second transistor, wherein the emitter of the sixth transistor is coupled to the collector of the fifth transistor.

15. The apparatus of claim 14 wherein the means for biasing the gain stage is operable to generate a first bias feedback signal and a second bias feedback signal.

16. The apparatus of claim 15 wherein the means for biasing the gain stage comprises a current mirror.

17. The apparatus of claim 15 wherein the means for biasing the gain stage comprises means for geometric mean bias feedback.

18. The apparatus of claim 15 wherein the means for biasing the gain stage comprises means for harmonic mean bias feedback.

19. The apparatus of claim 14 wherein the base of the third transistor receives a first input signal and wherein the base of the fourth transistor receives a second input signal.

20. The apparatus of claim 14 wherein the means for biasing the gain stage is operable to combine the bias reference signal with an input signal such that the input signal has high gain to an output of the gain stage and the bias reference signal has controlled gain to a bias point of the gain stage.

* * * * *